United States Patent
Yang et al.

(10) Patent No.: US 7,901,987 B2
(45) Date of Patent: Mar. 8, 2011

(54) PACKAGE-ON-PACKAGE SYSTEM WITH INTERNAL STACKING MODULE INTERPOSER

(75) Inventors: Joungin Yang, Koyang (KR); Dongjin Jung, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 260 days.

(21) Appl. No.: 12/051,280

(22) Filed: Mar. 19, 2008

(65) Prior Publication Data
US 2009/0236718 A1    Sep. 24, 2009

(51) Int. Cl.
*H01L 21/44* (2006.01)
(52) U.S. Cl. ......... 438/109; 438/127; 438/613; 257/686; 257/737; 257/787; 257/E25.013
(58) Field of Classification Search .................. 438/109, 438/127, 613; 257/686, 737, 787, E25.013
See application file for complete search history.

(56) References Cited

U.S. PATENT DOCUMENTS

| | | | |
|---|---|---|---|
| 6,798,057 B2 | 9/2004 | Bolkin et al. | |
| 6,861,288 B2 | 3/2005 | Shim et al. | |
| 7,259,028 B2 | 8/2007 | Takiar et al. | |
| 7,364,945 B2 * | 4/2008 | Shim et al. | 438/109 |
| 7,618,849 B2 * | 11/2009 | Khan et al. | 438/127 |
| 2006/0220256 A1 | 10/2006 | Shim et al. | |
| 2006/0284299 A1 * | 12/2006 | Karnezos | 257/686 |
| 2007/0216006 A1 | 9/2007 | Park et al. | |
| 2008/0258289 A1 * | 10/2008 | Pendse et al. | 257/690 |
| 2009/0001612 A1 * | 1/2009 | Song et al. | 257/787 |

OTHER PUBLICATIONS

Package-on-Package (POP), 2006, http://www.siliconfareast.com/pop.htm.
Mutschler, Ann S., STATS ChipPAC's fan-in package-on-package drives functional integration, EDN (Electronics Design, Strategy, News), Mar. 26, 2007, http://www.edn.com/index.asp?layout=article&articleid=CA6427767.
Die Stacking, http://www.siliconfareast.com/diestacking.htm.

* cited by examiner

*Primary Examiner* — Andy Huynh
(74) *Attorney, Agent, or Firm* — Mikio Ishimaru (57) ABSTRACT

A package-on-package system includes: forming a first integrated circuit package including second top electrical contacts and first external electrical contacts on opposite sides thereof; forming an internal stacking module interposer including first top electrical contacts and base electrical connectors on opposite sides thereof; attaching the internal stacking module interposer to the first integrated circuit package with the first top electrical contacts connected to the second top electrical contacts; and molding a package encapsulant over the first integrated circuit package and around the internal stacking module interposer leaving a package encapsulant cavity for attaching a stacked package to the base electrical connectors.

20 Claims, 3 Drawing Sheets

PACKAGE-ON-PACKAGE SYSTEM WITH INTERNAL STACKING MODULE INTERPOSER

TECHNICAL FIELD

The present invention relates generally to integrated circuit packages and more particularly to package-on-package system.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller footprints with more circuits in three-dimensional packages. In general, package stacks made by stacking packages and stacked chip packages made by stacking chips in a package have been used.

A Package-on-Package (PoP), as its name implies, is a semiconductor packaging innovation that involves the stacking of two or more packages on top of one another. The PoP is a three dimensional (3D) package in which a fully tested package, such as single die Ball-Grid-Array (BGA) or stacked die BGA (typically memory die), is stacked on a bottom PoP package which usually contains a logic device or logic device combination (logic plus logic, logic plus analog, etc.).

In standard PoP package designs, the top PoP package is interconnected to the bottom PoP package through solder balls around the periphery of the bottom PoP package.

The conventional vertically stacked multi-chip packages require space for forming electrical connections, such as with bond wires, and typically the space is formed by spacers, such as a blank silicon die or an interposer between the packages. These spacers limit the amount of height reduction possible. Conventional PoP configurations require space for package integration and/or stack, also limiting the reduction of the multi-chip package height.

The Fan-in Package-on-Package (Fi-PoP) package system allows stacking multiple logic, analogy, and memory devices in the bottom PoP package. The Fi-PoP package system structure allows for smaller conventional memory packages to be mounted with center ball grid array patterns on the top PoP package.

The Fi-PoP package system also accommodates larger die sizes in a reduced footprint as compared to conventional PoP designs. The footprint reflects what is typically the maximum dimension of the package, namely, the x-y dimension of the package in the horizontal plane.

The Fi-PoP accommodates multiple die and larger die sizes in a reduced footprint. The Fi-PoP package system has an interposer stacked onto a die or a premolded package and has bond wire interconnects to connect between the interposer and the bottom base carrier.

There are two versions of Fi-PoP with one version incorporating a fully-tested internal stacking module package for integration of fully tested memory or other device types within the bottom package. The second version integrates probed good or known good die stacked in the bottom package. Conventional memory packages can be stacked on top of either Fi-PoP design during the board mount process.

Multiple logic, analog, and memory devices can be stacked in the bottom of the Fi-PoP package. Smaller, conventional memory packages with center BGA patterns can be stacked on top, due to an exposed array of land pads on the top, center surface of the package.

The interconnection of the stacked packages can be quite challenging, especially if wire bonding is employed. Aside from the mechanical intricacies involved in managing the complex lay-out of hundreds of microscopic wires subject to loop profile restrictions, cross-talk during device operation must likewise be avoided.

Wire bonding is an electrical conductive structure that usually routes on the side of the stacked package system thus resulting in increased footprint.

Another drawback with the wire bonding in stacked packages is "wire sweep". Wire sweep results when a wave front of dielectric (commonly a silicon-filled polymer) encapsulation material moving through a mold cavity across the semiconductor die and carrier substrate assembly forces wire bonds to contact adjacent wire bonds and become fixedly molded in such a contacted position after the encapsulation material sets.

When wire sweep occurs, a wire bond of an integrated circuit die to a carrier substrate creates a short circuit, which results in a nonfunctional integrated circuit die assembly.

Generally, the conventional PoP package has a spacer die and any void or delamination in any of the die attach layers will result in locally increased thermal resistance, consequently may cause overheating, and finally might result even in ruining the device.

Thus, a need still remains for a stacked package-on-package system to provide smaller footprint, improved reliability while eliminating the bond wires at the stacking interface and eliminating the die spacer that may cause voids during the die attach process. In view of the ever-increasing need to minimize the size and the total height of the stacked package system, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a package-on-package system with an internal stacking module interposer including forming a first integrated circuit package including second top electrical contacts and first external electrical contacts on opposite sides thereof; forming an internal stacking module interposer including first top electrical contacts and base electrical connectors on opposite sides thereof; attaching the internal stacking module interposer to the first integrated circuit package with the first top electrical contacts connected to the second top electrical contacts; and molding a second encapsulant over the first integrated circuit package and around the internal stacking module interposer leaving a package encapsulant cavity for attaching a second integrated circuit package to the base electrical connectors.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals.

The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means that there is direct contact between different elements. The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

The term "Known Good Package" as used herein means that the package has test pads and can be tested before being stacked on another package.

The term "interposer" as used herein means a substrate or a bare silicon die that interconnects top and bottom packages.

The "footprint" as used herein reflects what is typically the maximum dimension of the package, namely, the x-y dimension of the package in the horizontal plane.

Figure 1:
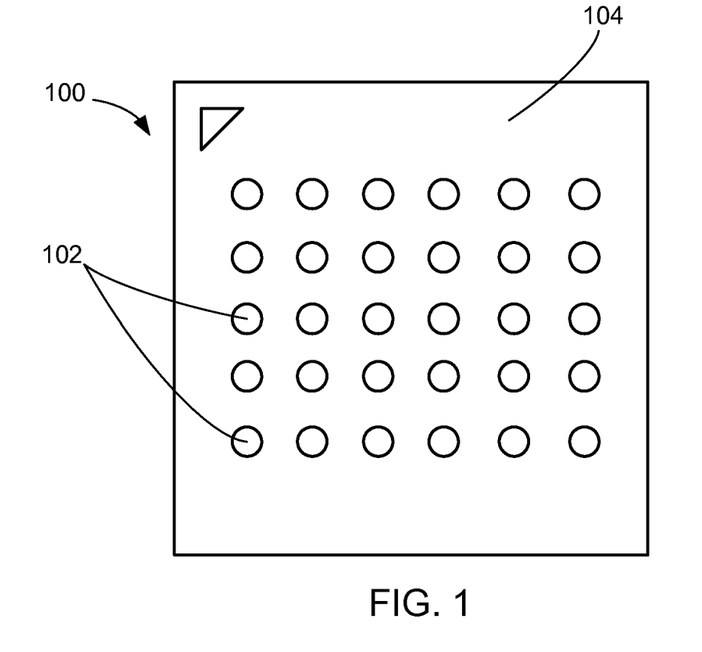
FIG. 1 is a bottom view of an internal stacking module interposer in an embodiment of the present invention.

Referring now to FIG. 1, therein is shown a bottom view of an internal stacking module interposer 100 in an embodiment of the present invention.

The internal stacking module interposer 100 structure includes a terminal pad array 102, such as solder mask defined pads, on an interposer substrate 104. The interposer substrate 104 is typically composed of a dielectric material.

The terminal pad array 102, such as solder mask defined pads, provide electrical and mechanical mounting surfaces for the internal stacking module interposer 100.

Figure 2:
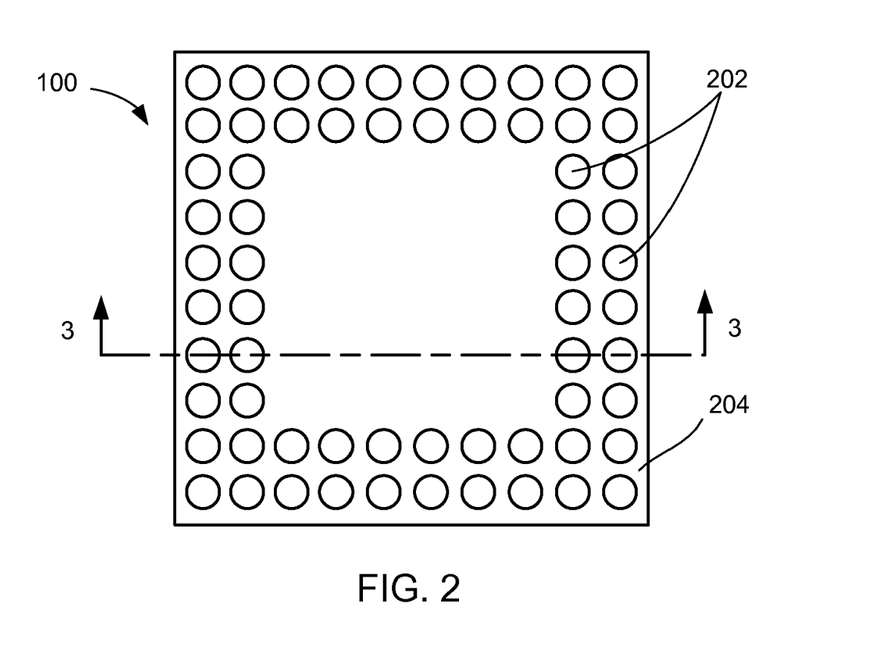
FIG. 2 is a top view of the internal stacking module interposer of FIG. 1.

Referring now to FIG. 2, therein is shown a top view of the internal stacking module interposer of FIG. 1. The top view of the internal stacking module interposer 100 includes first top electrical contacts 202, such as solder balls, partially embedded in an interposer encapsulant 204.

The interposer encapsulant 204, which is used to encapsulate and protect the internal stacking module interposer 100, leaves the first top electrical contacts 202 partially exposed to allow testing the electrical properties and functioning of the internal stacking module interposer 100.

The first top electrical contacts 202, which may be used as test pads or contact pads for the internal stacking module interposer 100, are mounted proximate an outer periphery (i.e., on the peripheral region) of the planar structure of the internal stacking module interposer 100 in more than one row.

Figure 3:
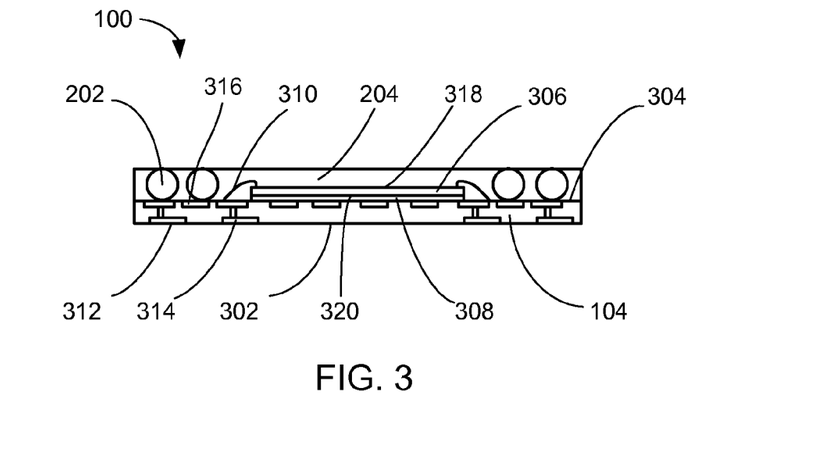
FIG. 3 is a cross-sectional view of the internal stacking module interposer along line 3-3 of FIG. 2 in an embodiment of the present invention.

Referring now to FIG. 3, therein is shown a cross-sectional view of the internal stacking module interposer 100 along line 3-3 of FIG. 2 in an embodiment of the present invention. The internal stacking module interposer 100 includes the interposer substrate 104 having a bottom surface 302 and a top surface 304, an integrated circuit die 306, an attachment material 308, such as a thermally conductive adhesive, side electrical interconnections 310, such as bond wires, the first top electrical contacts 202, such as solder balls, and the interposer encapsulant 204.

The interposer substrate 104 has base electrical connectors 312, such as metallic vias, to connect bottom electrical traces 314 mounted on the bottom surface 302 and top electrical traces 316 mounted on the top surface 304. The interposer substrate 104 has the integrated circuit die 306 mounted on the top surface 304.

The integrated circuit die 306 has an active side 318 and a non-active side 320. The non-active side 320 faces a plane of the top surface 304 of the interposer substrate 104 and attaches to the top surface 304 of the interposer substrate 104 using the attachment material 308, such as a thermally conductive adhesive, to provide improved thermal conductivity between the interposer substrate 104 and the integrated circuit die 306.

The integrated circuit die 306 is electrically coupled to the interposer substrate 104 using the side electrical interconnections 310, such as bond wires.

The interposer encapsulant 204 preferably covers the integrated circuit die 306 and the side electrical interconnections 310 about to the top surface 304 of the interposer substrate 104. The interposer encapsulant 204 partially encapsulates the first top electrical contacts 202 leaving the first top electrical contacts 202 partially exposed. The first top electrical contacts 202 extend entirely through and are exposed from the interposer encapsulant 204 and are in direct contact with the interposer substrate 104.

The interposer encapsulant 204 may be formed from a number of materials, such as an elastomer or a rigid resin (thermoset epoxy, silicone and polyurethane), and is used to encapsulate and protect the internal stacking module interposer 100 from shock and vibration.

The interposer encapsulant 204 provides rugged protection and helps to ensure a long service life for the internal stacking module interposer 100.

Figure 4:
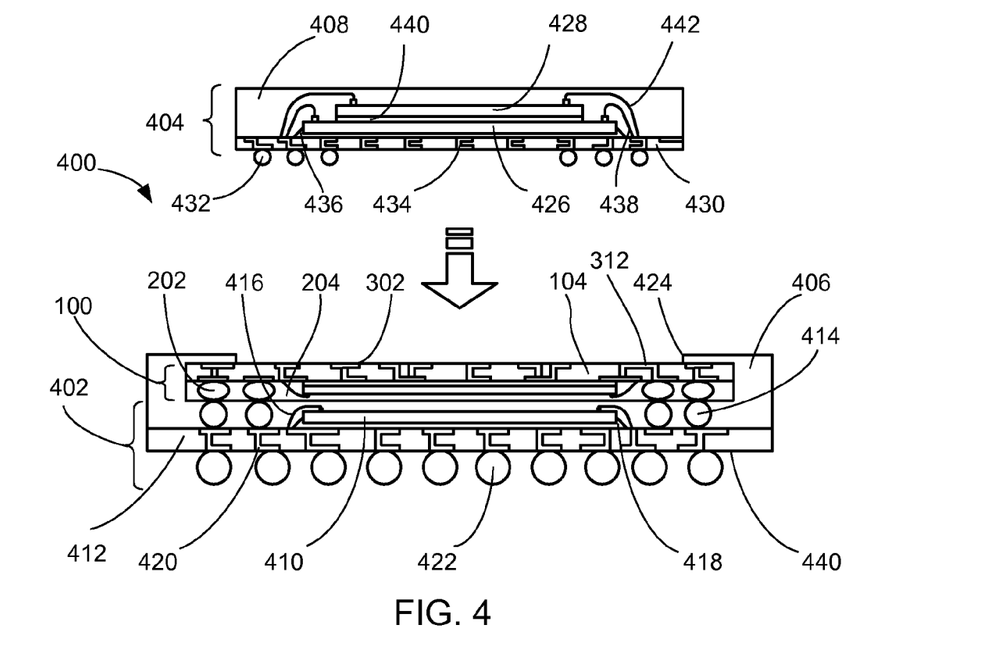
FIG. 4 is a cross-sectional view of a package-on-package system with the internal stacking module interposer in a first embodiment of the present invention.

Referring now to FIG. 4, therein is shown a cross-sectional view of a package-on-package system 400 with the internal stacking module interposer 100 in a first embodiment of the present invention.

The package-on-package system 400 includes the internal stacking module interposer 100, a first integrated circuit package 402, and a stacked package 404.

The internal stacking module interposer 100 and include an integrated circuit, such as a memory device, surrounded by the interposer encapsulant 204.

The stacked package 404 can include an integrated circuit surrounded by a stacked package encapsulant 408.

The first integrated circuit package 402 can include an integrated circuit, such as a logic device, surrounded by a package encapsulant 406. The first integrated circuit package 402 includes a first integrated circuit die 410, a first base carrier 412, second top electrical contacts 414, such as solder balls, and first side electrical interconnections 416, such as bond wires.

The bottom of the first integrated circuit die 410 is thermally coupled to the first base carrier 412 using a first attachment material 418, such as a thermally conductive adhesive, to provide improved thermal conductivity between the first integrated circuit die 410 and the first base carrier 412. The top of the first integrated circuit die 410 is electrically connected to the first base carrier 412 using the first side electrical interconnections 416, such as bond wires.

The first base carrier 412 may be a dielectric material, which has first base connectors 420, such as metallic vias within the dielectric material, to provide electrical connection between the first base carrier 412 and the next level of system, such as a printed circuit board (not shown).

On top of the first base carrier 412 are mounted the second top electrical contacts 414, such as solder balls, to electrically couple the first integrated circuit package 402 to the internal stacking module interposer 100.

On bottom of the first base carrier 412 are mounted first external electrical contacts 422, such as solder balls, to provide connection to the next level of system, such as a printed circuit board (not shown).

The internal stacking module interposer 100 is inverted and placed on top of the first integrated circuit package 402.

The first top electrical contacts 202 of the internal stacking module interposer 100 are mounted in a pattern complimentary to a pattern of the second top electrical contacts 414 mounted on top of the first base carrier 412.

To provide electrical connection between the internal stacking module interposer 100 and the first integrated circuit package 402, the first top electrical contacts 202 and the second top electrical contacts 414 are reflowed together. The first integrated circuit package 402 and the internal stacking module interposer 100 are then encapsulated using the package encapsulant 406.

The package encapsulant 406 surrounds the first integrated circuit package 402 over the top of the first base carrier 412 and surrounds the internal stacking module interposer 100 leaving a package encapsulant cavity 424 that partially exposes the bottom surface 302 of the interposer substrate 104 to attach the stacked package 404 to the internal stacking module interposer 100.

The package encapsulant 406 may be formed from a number of materials, such as an elastomer or a rigid resin (thermoset epoxy, silicone and polyurethane), and is used to protect the first integrated circuit package 402 and the internal stacking module interposer 100.

The stacked package 404, which may be a memory device system, includes a bottom integrated circuit die 426 and a top integrated circuit die 428 stacked on top of each other, a second base carrier 430, second external electrical contacts 432, and the stacked package encapsulant 408.

The second base carrier 430 may be a dielectric material, which has second base connectors 434 within the dielectric material to provide electrical connection between the second base carrier 430 and the next level of system, such as the internal stacking module interposer 100.

The bottom integrated circuit die 426 is thermally coupled to the second base carrier 430 using a second attachment material 436, such as a thermally conductive adhesive, to provide improved thermal conductivity between the bottom integrated circuit die 426 and the second base carrier 430.

The bottom integrated circuit die 426 is electrically coupled to the second base carrier 430 using second side electrical interconnections 438, such as bond wires.

The top integrated circuit die 428 is thermally coupled to the bottom integrated circuit die 426 using a third attachment material 440, such as a thermally conductive adhesive. The top integrated circuit die 428 is electrically coupled to the second base carrier 430 using third side electrical interconnections 442, such as bond wires.

The second base carrier 430 has the second external electrical contacts 432 arranged in a pattern complimentary to a pattern of the base electrical connectors 312 on the bottom surface 302 of the interposer substrate 104 to provide electrical connection between the internal stacking module interposer 100 and the stacked package 404.

The stacked package encapsulant 408 encapsulates over the top of the second base carrier 430, the top integrated circuit die 428, the second side electrical interconnections 438, the third side electrical interconnections 442, and a small portion of the bottom integrated circuit die 426 that extends under the top integrated circuit die 428. The stacked package encapsulant 408 encapsulates, protects and establishes structural integrity to the stacked package 404.

It has been discovered that using the first top electrical contacts 202 on the internal stacking module interposer 100 reduces the footprint of the package-on-package system 400.

The footprint reflects what is typically the maximum dimension of the package, namely, the x-y dimension of the package in the horizontal plane.

Since the electrical signal is transmitted from the printed circuit board (not shown) to the internal stacking module interposer 100 via the first base carrier 412, and to the stacked package 404 via the internal stacking module interposer 100, the electrical signal is moving in an "inward" direction; thus, we could call this system a Fan-in package-on-package system.

It has been discovered that the package-on-package system 400 with the internal stacking module interposer 100 allows the stacking of multiple logic, analog and memory integrated circuit packages at the bottom of the stacked package system and accommodates larger die sizes in a reduced footprint.

It has been discovered that the package-on-package system 400 with the internal stacking module interposer 100 also allows for smaller conventional memory packages to be mounted with center ball grid array patterns on the top of the package-on-package system 400 with the internal stacking module interposer 100.

It has been discovered that the package-on-package system 400 with the internal stacking module interposer 100 expands the range of integration schemes available to customers in the bottom package and delivers a cost effective, high yield solution in a smaller package size, especially for the top memory package.

It has been discovered that depending on die size and complexity, the package-on-package system 400 with the internal stacking module interposer 100 can reduce the final footprint up to 25 percent in the bottom of the package-on-package system 400 with internal stacking module interposer 100 with a space savings of up to 65 percent in the top of the package-on-package system 400 with the internal stacking module interposer 100.

It has also been discovered that using the first top electrical contacts 202 for the electrical interconnection between the first integrated circuit package 402 and the internal stacking module interposer 100 eliminates the damage of the exposed wire or wire sweeping.

It has been discovered that using the internal stacking module interposer 100 eliminates the need for spacer die interposer (not shown) between the first integrated circuit package 402 and the stacked package 404. The spacer die interposer (not shown) may lead to voids and delamination during the die attach process.

It has been discovered that eliminating the spacer die interposer (not shown) reduces the total height of the package-on-package system 400 as the thickness of the interposer encapsulant 204 is controlled by the bond wire-loop height which is used with the spacer die interposer (not shown).

Yet another valuable aspect of the present invention is that the internal stacking module interposer 100 has the first top electrical contacts 202 that allow the internal stacking module interposer 100 to be tested before final encapsulation. Thus, the internal stacking module interposer 100 may be used as the "Known Good Package".

Figure 5:
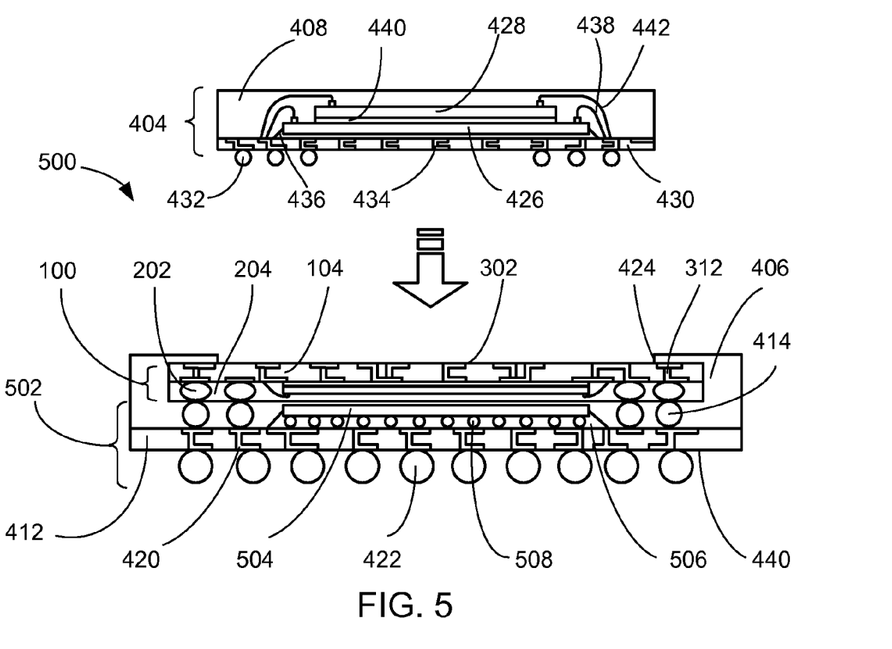
FIG. 5 is a package-on-package system with the internal stacking module interposer in a second embodiment of the present invention.

Referring now to FIG. 5, is a cross-sectional view of a package-on-package system 500 with the internal stacking module interposer 100 in a second embodiment of the present invention.

The package-on-package system 500 includes the internal stacking module 100, a first integrated circuit package 502, such as flip chip integrated circuit package, the stacked package 404, the package encapsulant 406, and the stacked package encapsulant 408.

The first integrated circuit package 502, which is a flip chip integrated circuit package, includes a first integrated circuit die 504, an underfill 506, the first base carrier 412, the first base connectors 420, such as metallic vias, conductive bumps 508, the second top electrical contacts 414, and the first external electrical contacts 422.

The underfill 506 is used to protect the conductive bumps 508 from moisture or other environmental hazards, and to provide additional mechanical strength to the first integrated circuit package 502. However, its most important purpose is to compensate for any thermal expansion difference between the first integrated circuit die 504 and the first base carrier 412.

The underfill 506 mechanically "locks together" the first integrated circuit die 504 and the first base carrier 412 so that differences in thermal expansion do not break or damage the electrical connection of the conductive bumps 508.

The first base carrier 412 may be a dielectric material, which has the first base connectors 420, such as metallic vias within the dielectric material, to provide electrical connection between the first base carrier 412 and the next level of system, such as a printed circuit board (not shown).

On top of the first base carrier 412 are mounted the second top electrical contacts 414, such as solder balls, to electrically couple the first integrated circuit package 502 to the internal stacking module interposer 100.

On bottom of the first base carrier 412 are mounted the first external electrical contacts 422, such as solder balls, to provide connection to the next level of system, such as a printed circuit board (not shown).

The internal stacking module interposer 100 is inverted and placed on top of the first integrated circuit package 502.

The first top electrical contacts 202 of the internal stacking module interposer 100 are mounted in a pattern complimentary to a pattern of the second top electrical contacts 414 mounted on top of the first base carrier 412.

To provide electrical connection between the internal stacking module interposer 100 and the first integrated circuit package 502, the first top electrical contacts 202 and the second top electrical contacts 414 are reflowed together. The first integrated circuit package 502 and the internal stacking module interposer 100 are then encapsulated using the package encapsulant 406.

The package encapsulant 406 surrounds the first integrated circuit package 502 over the top of the first base carrier 412 and surrounds the internal stacking module interposer 100 leaving the package encapsulant cavity 424 that partially exposes the bottom surface 302 of the interposer substrate 104 to attach the stacked package 404 to the internal stacking module interposer 100.

The stacked package 404, which may be a memory device system, includes the bottom integrated circuit die 426 and the top integrated circuit die 428 stacked on top of each other, the second base carrier 430, the second external electrical contacts 432, and the stacked package encapsulant 408.

The second base carrier 430 may be a dielectric material, which has the second base connectors 434 within the dielectric material to provide electrical connection between the second base carrier 430, and the next level of system, such as the internal stacking module interposer 100.

The bottom integrated circuit die 426 is thermally coupled to the second base carrier 430 using the second attachment material 436, such as a thermally conductive adhesive, to provide improved thermal conductivity between the bottom integrated circuit die 426 and the second base carrier 430.

The bottom integrated circuit die 426 is electrically coupled to the second base carrier 430 using the second side electrical interconnections 438, such as bond wires.

The top integrated circuit die 428 is thermally coupled to the bottom integrated circuit die 426 using the third attachment material 440, such as a thermally conductive adhesive. The top integrated circuit die 428 is electrically coupled to the second base carrier 430 using the third side electrical interconnections 442, such as bond wires.

The second base carrier 430 has the second external electrical contacts 432 arranged in a pattern complimentary to a pattern of the base electrical connectors 312 on the bottom surface 302 of the interposer substrate 104 to provide electrical connection between the internal stacking module interposer 100 and the stacked package 404.

The stacked package encapsulant 408 encapsulates over the top of the second base carrier 430, the top integrated circuit die 428, the second side electrical interconnections 438, the third side electrical interconnections 442, and a small portion of the bottom integrated circuit die 426 that extends under the top integrated circuit die 428. The stacked package encapsulant 408 encapsulates, protects and establishes structural integrity to the stacked package 404.

Figure 6:
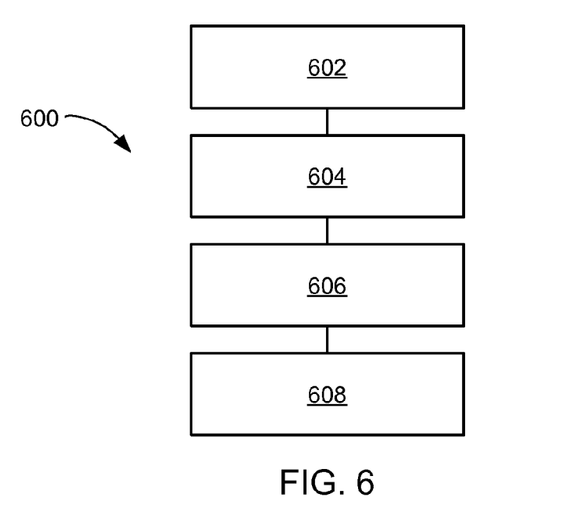
FIG. 6 is a flow chart of a package-on-package system with the internal stacking module interposer for manufacturing the package-on-package system with the internal stacking module interposer.

Referring now to FIG. 6, therein is shown is a flow chart of a package-on-package system 600 with the internal stacking module interposer 100 for manufacturing the package-on-package system 600 with the internal stacking module interposer 100.

The package-on-package system 600 with the internal stacking module interposer 100 includes: forming a first integrated circuit package including second top electrical contacts and first external electrical contacts on opposite sides thereof in a block 602; forming an internal stacking module interposer including first top electrical contacts and base electrical connectors on opposite sides thereof in a block 604; attaching the internal stacking module interposer to the first integrated circuit package with the first top electrical contacts connected to the second top electrical contacts in a block 606; and molding a second encapsulant over the first integrated circuit package and around the internal stacking module interposer leaving a package encapsulant cavity for attaching a second integrated circuit package to the base electrical connectors in a block 608.

It has been discovered that the package-on-package system with the internal stacking module interposer structure allows the stacking of multiple logic, analog and memory die in the bottom of the package-on-package system with internal stacking module interposer and accommodates larger die sizes in a reduced footprint with the structure also allowing for smaller conventional memory packages to be mounted with center ball grid array patterns on the top of the package-on-package system with internal stacking module interposer.

It has also been discovered that using the internal stacking module interposer between the first integrated circuit and the second integrated circuit can eliminate the damage of the exposed wire and wire sweeping since it eliminates the wire bonding.

It has been discovered that using the internal stacking module interposer eliminates the need for a spacer die between the first integrated circuit package and the second integrated circuit package. The spacer dies can lead to voids and delamination during the die attach process.

It has been unexpectedly discovered that the internal stacking module interposer has the package test pads that allow the internal stacking module interposer to be tested before final encapsulation. Thus, the internal stacking module interposer becomes the "Known Good Package".

These and other valuable aspects of the present invention consequently further the state of the technology to at least the next level.

Thus, it has been discovered that the package-on-package system with internal stacking module interposer furnishes valuable and heretofore unknown and unavailable solutions, capabilities, and functional aspects for the stacked package systems. The resulting processes and configurations are straightforward, cost-effective, uncomplicated, highly versatile and effective, can be implemented by adapting known technologies, and are thus readily suited for efficiently and economically manufacturing stacked package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a package-on-package system comprising:
    forming a first integrated circuit package including second top electrical contacts and first external electrical contacts on opposite sides thereof;
    forming an internal stacking module interposer including first top electrical contacts and base electrical connectors on opposite sides thereof, and the first top electrical contacts extending entirely through and are exposed from an interposer encapsulant;
    attaching the internal stacking module interposer to the first integrated circuit package with the first top electrical contacts connected to the second top electrical contacts; and
    molding a package encapsulant over the first integrated circuit package and around the internal stacking module interposer leaving a package encapsulant cavity for attaching a stacked package to the base electrical connectors.

2. The method as claimed in claim 1 wherein forming the internal stacking module interposer comprises:
    providing an interposer substrate;
    attaching an integrated circuit die to the interposer substrate;
    placing the first top electrical contacts on a top surface of the interposer substrate; and
    molding the interposer encapsulant over the integrated circuit die and about to the top surface of the interposer substrate.

3. The method as claimed in claim 1 wherein attaching the internal stacking module interposer on the first integrated circuit package comprises:
    inverting the internal stacking module interposer;
    placing the internal stacking module interposer over the first integrated circuit package;
    reflowing the first top electrical contacts of the internal stacking module interposer over the second top electrical contacts of the first integrated circuit package; and
    molding the package encapsulant over the first integrated circuit package and around the internal stacking module interposer.

4. The method as claimed in claim 1 wherein attaching the stacked package comprises attaching the stacked package to a bottom surface of the internal stacking module interposer for electrical connection between second external electrical contacts and the base electrical connectors.

5. The method as claimed in claim 1 wherein molding the package encapsulant comprises surrounding the first integrated circuit package about to a first base carrier and partially surrounding the internal stacking module interposer with the package encapsulant.

6. A method for manufacturing a package-on-package system comprising:
   forming an internal stacking module interposer having an interposer substrate, first top electrical contacts extending entirely through and are exposed from an interposer encapsulant, and an integrated circuit die;
   providing a first integrated circuit package having a first base carrier with second top electrical contacts, a first integrated circuit die, side interconnections, and first external electrical contacts;
   inverting the internal stacking module interposer;
   attaching the internal stacking module interposer to the first integrated circuit package using the first top electrical contacts;
   molding a package encapsulant over the first integrated circuit package and the internal stacking module interposer leaving a bottom surface of the interposer substrate exposed;
   providing a stacked package having a second base carrier, a bottom integrated circuit die, a top integrated circuit die, second external electrical contacts, and a stacked package encapsulant; and
   attaching the stacked package on the bottom surface of the internal stacking module interposer.

7. The method as claimed in claim 6 wherein forming the internal stacking module interposer comprises molding an interposer encapsulant over a top surface of the interposer substrate and leaving the first top electrical contacts partially exposed.

8. The method as claimed in claim 6 wherein attaching the internal stacking module interposer to the first integrated circuit package includes attaching the internal stacking module interposer to a logic device package or a flip chip integrated circuit package.

9. The method as claimed in claim 6 wherein attaching the stacked package to the internal stacking module interposer comprises:
   placing the stacked package on the bottom surface of the internal stacking module interposer; and
   attaching the stacked package to the internal stacking module interposer using the second external electrical contacts.

10. The method as claimed in claim 6 wherein molding the package encapsulant over the first integrated circuit package and around the internal stacking module interposer leaves a package encapsulant cavity for attaching a stacked package over the internal stacking module interposer.

11. A package-on-package system comprising:
   a first integrated circuit package including second top electrical contacts and first external electrical contacts on opposite sides thereof, and the first top electrical contacts extending entirely through and are exposed from an interposer encapsulant;
   an internal stacking module interposer including first top electrical contacts and base electrical connectors on opposite sides thereof, the internal stacking module interposer attached to the first integrated circuit package with the first top electrical contacts connected to the second top electrical contacts; and
   a package encapsulant molded over the first integrated circuit package and around the internal stacking module interposer leaving a package encapsulant cavity for attaching a stacked package to the base electrical connectors.

12. The system as claimed in claim 11 wherein forming the internal stacking module interposer comprises:
   an interposer substrate, the first top electrical contacts on a top surface of the interposer substrate;
   an integrated circuit die attached to the interposer substrate; and
   wherein:
   the interposer encapsulant is molded over the integrated circuit die and about to the top surface of the interposer substrate.

13. The system as claimed in claim 11 wherein the internal stacking module interposer attached on the first integrated circuit package comprises:
   the internal stacking module interposer inverted over the first integrated circuit package;
   the first top electrical contacts of the internal stacking module interposer reflowed over the second top electrical contacts of the first integrated circuit package; and
   the package encapsulant molded over the first integrated circuit package and around the internal stacking module interposer.

14. The system as claimed in claim 11 wherein attaching the stacked package comprises attaching the stacked package to a bottom surface of the internal stacking module interposer for electrical connection between second external electrical contacts and the base electrical connectors.

15. The system as claimed in claim 11 wherein molding the package encapsulant comprises surrounding the first integrated circuit package about to a first base carrier and partially surrounding the internal stacking module interposer with the package encapsulant.

16. The system as claimed in claim 11 wherein:
   the first integrated circuit package having a first base carrier with the second top electrical contacts, the first external electrical contacts, a first integrated circuit die, and side interconnections;
   the internal stacking module interposer having an interposer substrate with first top electrical contacts, an integrated circuit die, and the interposer encapsulant;
   the package encapsulant molded over the first integrated circuit package and the internal stacking module interposer leaving a bottom surface of the interposer substrate exposed; and
further comprising:
   a stacked package having a second base carrier with a bottom integrated circuit die, a top integrated circuit die, second external electrical contacts, and a stacked package encapsulant, the stacked package attached on the bottom surface of the internal stacking module interposer.

17. The system as claimed in claim 16 wherein the internal stacking module interposer comprises the interposer encapsulant molded over a top surface of the interposer substrate and leaving the first top electrical contacts partially exposed.

18. The system as claimed in claim 16 wherein the internal stacking module interposer attached to the first integrated circuit package includes the internal stacking module interposer attached to a logic device package or a flip chip integrated circuit package.

19. The system as claimed in claim 16 wherein the stacked package attached to the internal stacking module interposer comprises:

the stacked package placed on the bottom surface of the internal stacking module interposer; and the stacked package attached to the internal stacking module interposer using the second external electrical contacts.

20. The system as claimed in claim 16 wherein the package encapsulant attached over the first integrated circuit package and around the internal stacking module interposer leaves a package encapsulant cavity for a stacked package to be attached over the internal stacking module interposer.

* * * * *